(12) United States Patent
Koch

(10) Patent No.: US 7,683,655 B2
(45) Date of Patent: Mar. 23, 2010

(54) INTEGRATED CIRCUIT

(75) Inventor: Anton Koch, Elztal-Auerbach (DE)

(73) Assignee: Atmel Automotive GmbH, Heilbronn (DE)

( * ) Notice: Subject to any disclaimer, the term of this patent is extended or adjusted under 35 U.S.C. 154(b) by 86 days.

(21) Appl. No.: 12/015,497

(22) Filed: Jan. 16, 2008

(65) Prior Publication Data

US 2008/0197875 A1 Aug. 21, 2008

Related U.S. Application Data

(60) Provisional application No. 60/880,377, filed on Jan. 16, 2007.

(30) Foreign Application Priority Data

Jan. 17, 2007 (DE) .................... 10 2007 002 502

(51) Int. Cl.
*H03K 16/17* (2006.01)
(52) U.S. Cl. .................... 326/21; 326/31; 326/104
(58) Field of Classification Search .............. 326/21, 326/31, 104; 327/259, 142
See application file for complete search history.

(56) References Cited

U.S. PATENT DOCUMENTS

| 4,291,240 | A | * | 9/1981 | Rosler ..................... 327/259 |
| 4,293,780 | A | * | 10/1981 | Roesler ..................... 327/142 |
| 4,307,306 | A |  | 12/1981 | Kucharewski |
| 5,216,292 | A |  | 6/1993 | Imazu et al. |
| 5,283,479 | A | * | 2/1994 | Rosseel et al. ............. 326/104 |
| 5,444,392 | A | * | 8/1995 | Sommer et al. ............. 326/31 |
| 5,952,850 | A |  | 9/1999 | Hojo et al. |
| 6,285,209 | B1 |  | 9/2001 | Sawai |

FOREIGN PATENT DOCUMENTS

| DE | 30 18 604 | 11/1980 |
| EP | 0 085 991 A2 | 8/1983 |
| JP | 58-175324 | 10/1983 |

* cited by examiner

*Primary Examiner*—Jean B Jeanglaude
(74) *Attorney, Agent, or Firm*—Muncy, Geissler, Olds & Lowe, PLLC

(57) ABSTRACT

An integrated circuit is provided having at least one terminal for coupling and/or decoupling of electric signals, particularly of digital signals, and having integrated reference potential means, assigned to the terminal, for providing an electric reference potential to the terminal. It is provided according to an embodiment of the invention that the reference potential means is switchable, particularly by an override process.

14 Claims, 2 Drawing Sheets

INTEGRATED CIRCUIT

This nonprovisional application claims priority to German Patent Application No. DE 102007002502, which was filed in Germany on Jan. 17, 2007, and to U.S. Provisional Application No. 60/880,377, which was filed on Jan. 16, 2007, and which are both herein incorporated by reference.

BACKGROUND OF THE INVENTION

1. Field of the Invention

The present invention relates to an integrated circuit having at least one terminal for coupling and/or decoupling of electric signals, particularly of digital signals, and having integrated reference potential means, assigned to the terminal, for providing an electric reference potential to the terminal.

2. Description of the Background Art

Conventional integrated circuits are realized as a semiconductor component and have a plurality of internal and external terminals. The internal terminals are formed as nodal points of electric conductors between individual circuit components, realized in the circuit, such as resistors, capacitors, or transistors. The external terminals are realized as electromechanical interfaces, which typically enable an electrical connection of the integrated circuit with a printed circuit or other electrical components via bond wire connections or solder ball connections. To assure the proper functioning of the integrated circuit, it is desirable that each terminal at each point in time has a defined electric potential. As a result, interference by electric signals, which, for example, are applied at neighboring terminals and can be transmitted via inductive or capacitive couplings, can be avoided.

The prior-art integrated circuit for this purpose has reference potential means at terminals that are not assigned any permanent and clear electric potential or a corresponding useful signal. The reference potential means apply a defined electric potential at the terminal in absence of the useful signal. Known reference potential means are realized as pull-up circuits or as pull-down circuits. In this case, a terminal is connected to a higher or lower voltage potential via a high-impedance resistor, so that in the absence of a useful signal the terminal has the corresponding voltage potential. As soon as a useful signal is applied to the terminal, the electric potential at the terminal is defined by the useful signal due to the high-impedance coupling of the pull-up circuit or the pull-down circuit. Because of the high-impedance resistor, reference potential means made in this manner require a certain area on the integrated circuit and are not suitable for all types of terminals.

SUMMARY OF THE INVENTION

It is therefore an object of the present invention to provide an integrated circuit having a reference potential usable for different terminals.

This object is attained by an integrated circuit, in which the reference potential is switchable. The switchable reference potential can be switched at least between a first and a second switching state. For example, it can be provided in the first switching state that the reference potential provides a predefinable electric potential, particularly a constant supply voltage, to the terminal, so that it is protected against radiation or coupling of interference signals. It can be provided in the second switching state that the reference potential does not provide an electric potential to the terminal, because the useful signal applied at the terminal assures that the terminal has a defined electric potential. In this case, the useful signal can have a constant or periodically or irregularly changing signal level. The useful signal is generated by a useful signal source, which provides no useful signal in predefinable operating states of the integrated circuit. For this case, it can be provided with use of the reference potential that instead of the useful signal, the electric potential, provided by the reference potential, occurs at the terminal to prevent radiation or coupling of undesirable interference radiation.

An embodiment of the invention provides that the reference potential can have a control input, which is formed for coupling a control signal, provided for switching the reference potential to supply the reference potential to the terminal. In the absence of a useful signal, the reference potential can be connected to the control input in such a way that a predefinable electric potential is applied at the terminal. The control signal can be coupled from outside into the integrated circuit; the control signal is advantageously generated internally in the integrated circuit. The reference potential can be set up such that only a short electric pulse is needed to cause a switching to provide a reference potential. It is advantageous for the reference potential to be set up such that no or at least virtually no electric current flow is necessary to cause a switching.

Another embodiment of the invention provides that the reference potential has a switching means, which are formed for an alternative provision of the reference potential or a useful signal at a signal output depending on a useful signal level. The switching means are formed for switching between the useful signal and the reference potential depending on the useful signal level.

It is provided in another embodiment of the invention that the switching means have a signal input, which is connected in particular to the useful signal source. Therefore, the switching means can provide the useful signal at the terminal. The switching means are preferably set up in such a way that a useful signal, applied at the signal input, causes the switching of the reference potential, so that the useful signal is provided at the signal output. In other words, the switching means is formed such that the useful signal can also be used as a control signal or switching signal for the switching means and can induce the switching process by overriding the existing logic state in the reference potential. Switching of the reference potential to the useful signal can therefore occur without an additional control signal. Another embodiment of the invention provides that in the absence of a useful signal an automatic switching to the reference potential occurs, without a control signal needing to be applied for this purpose at the signal input of the reference potential.

Another embodiment of the invention provides that the switching means for the reference potential are formed self-sustaining. The switching means are therefore set up in such a way that even a short switching pulse of a control signal is sufficient to bring about a switching of the switching means. The control signal is no longer necessary starting at the time when a switching has occurred. Rather, the switching means are set up such that with the switching a stable internal state is assumed in which the reference potential is provided at the terminal. Another switching to enable the provision of the useful signal to the terminal does not occur until the useful signal overrides the reference potential.

Another embodiment of the invention provides that the switching means have at least one field-effect transistor, which has a control terminal with a width/length ratio less than 1, preferably less than $\frac{1}{2}$, especially preferably less than $\frac{1}{5}$. The control terminal of the field-effect transistor, which is also called the gate terminal, can be realized as a polysilicon layer region in a semiconductor layer structure between a first current terminal (source terminal) and a second current terminal (gate terminal). In this case, the ratio of the width, therefore an extension orthogonal to a connecting line between the source terminal and the drain terminal, to the length, therefore the distance between the source terminal and the drain terminal, has a considerable effect on the switching behavior of the field-effect transistor. At a width/length ratio less than 1, the distance between the source terminal and the gate terminal is the same or greater than the width of the control terminal. As a result, a high voltage drop can be achieved between the source terminal and the gate terminal, so that a switching process of the field-effect transistor can be brought about even with a low control voltage. This is the result of the high-impedance design of the field-effect transistor, which for this reason can be overwritten by a low-impedance signal at the input.

Another embodiment of the invention provides that the switching means have a NAND gate, which has at least one field-effect transistor, which has a control terminal with a width/length ratio less than 1, preferably less than ½, especially preferably less than ⅕. It is provided in this case that a first input of the NAND gate is connected to the signal input and a second input of the NAND gate to the control input. The NAND gate therefore provides a logic low signal only when all inputs are at a logic high level. By using field-effect transistors with a width/length ratio less than 1, the NAND gate, whose output is connected to an input of the NAND gate to assure the self-sustaining properties of the reference potential means, can be switched from providing a reference potential at the terminal to the useful signal at the terminal even with the occurrence of a useful signal with a low signal level.

Another embodiment of the invention provides that a first inverter is disposed between the signal input and the first input of the NAND gate to invert the useful signal. As a result, for an advantageous adaptation to the logic structure of the switching means, the useful signal is first inverted, before it is made available to the NAND gate.

Another embodiment of the invention provides that the signal output is connected to a node between the first inverter and the first input of the NAND gate, whereby a second inverter is disposed between the node and the signal output. This assures that the useful signal that was supplied at the signal input is present at the signal output without inversion. Provided that a useful signal is not supplied at the signal input, the inverted electric potential of the node between the first inverter and the first input of the NAND gate is applied at the signal output.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
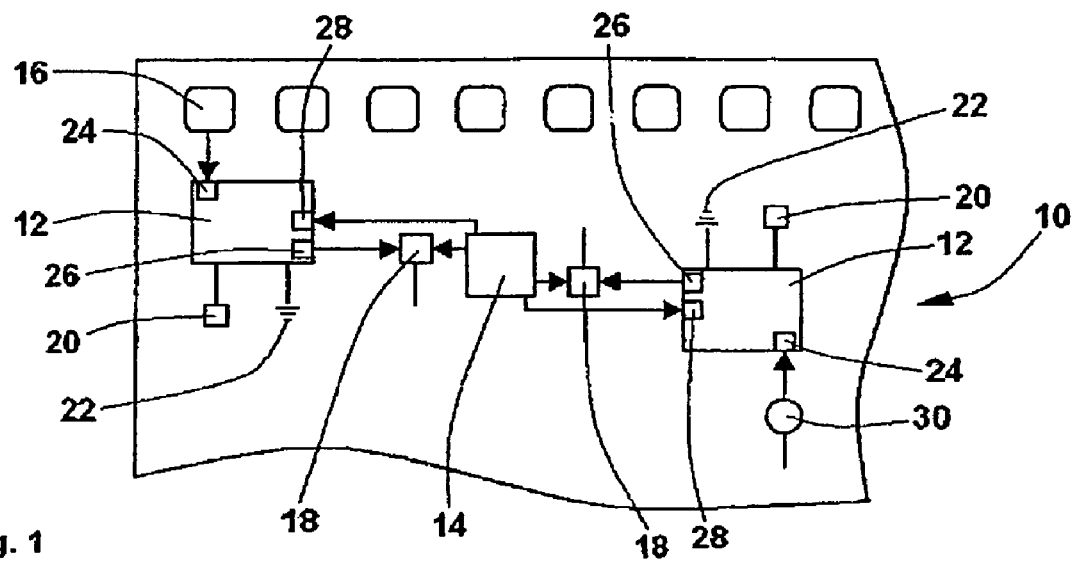
FIG. 1 shows a schematic block diagram of an integrated circuit with a terminal assigned to the reference potential.

FIG. 1 shows a schematic block diagram of an integrated circuit 10, which is realized as a layer structure on a semiconductor crystal, not shown in greater detail. Different functional regions, which are shown as a greatly simplified illustration in FIG. 1, are realized by structuring of different layers on the semiconductor crystal. The selected illustration is used exclusively to explain the functional relationships and is not to be understood as an image of a semiconductor layout.

Integrated circuit 10 has a number of bond pads 16, which are provided as contact areas for the attachment of bond wires (not shown). An electric coupling of integrated circuit 10 to a printed circuit board/printed circuit (not shown in greater detail) can be realized with the bond wires. A plurality of reference potential means 12, provided for supplying electric reference potentials to terminals 18, are formed on integrated circuit 10. Terminals 18 are realized as internal electric nodal points between a bond pad 16 and a circuit part (not shown) or between a symbolically shown internal connecting point 30 and a circuit part (not shown).

Electric connections with reference potential means 12, which are shown as arrows, are provided proceeding from bond pad 16 or from internal connecting point 30. The direction of the arrows indicates the effective direction of the signals transmitted in the particular case. A useful signal applied at bond pad 16 or at the internal connecting point can thereby be supplied at signal input 24 of reference potential means 12 and is conducted further from there to the particular terminal 18 in a manner described in greater detail hereinafter.

Reference potential means 12 have a signal output 26, a supply terminal 20, and a ground terminal 22, apart from signal input 24. Signal output 26 is connected to terminal 18. Supply terminal 20 is connected to a voltage source (not shown). Ground terminal 22 is at ground potential. A control unit 14, which can provide a control signal at a control input 28 of reference potential means 12, is provided for controlling reference potential means 12.

Reference potential means 12 are set up in such a way that a defined electric potential can be provided at terminal 18 in the absence of a useful signal at signal input 24. For this purpose, a control signal is provided to control input 28 of reference potential means 12 by control device 14. The control signal supplied to control terminal 28 as a short-time electric pulse causes a switching of reference potential means 12, so that in the absence of the useful signal it can provide a defined electric (reference) potential at terminal 18. Due to the self-sustaining design of reference potential means 12, only a short pulse of the control signal is necessary to cause the switching of reference potential means 12. Starting at the time of switching to the reference potential, reference potential means 12 need not be supplied with another electric signal to assure the provision of the reference potential at terminal 18. When a useful signal is supplied to signal input 24, switching of reference potential means 12 occurs automatically, so that the useful signal is provided to terminal 18 starting at this time.

Figure 2:
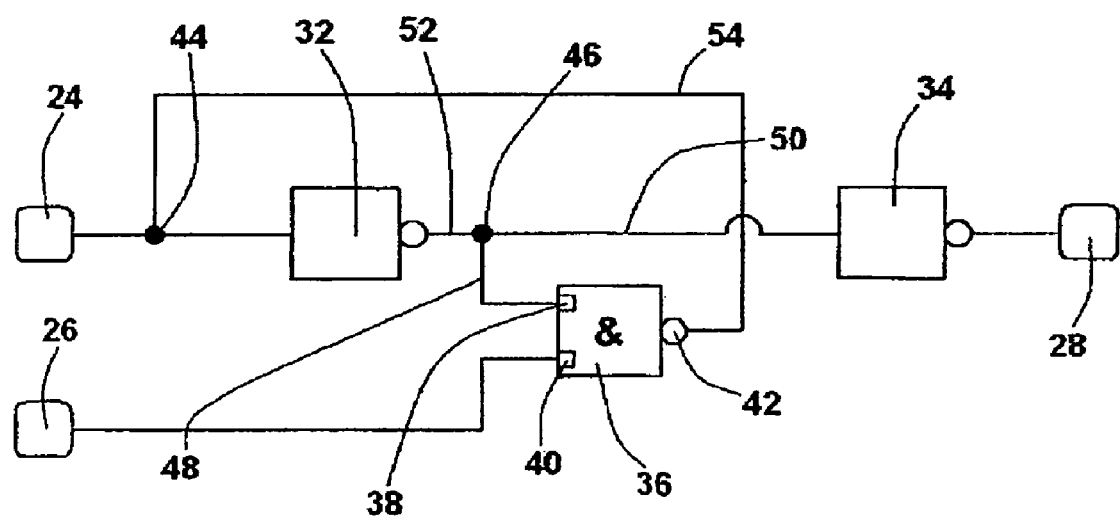
FIG. 2 shows a schematic block diagram of the reference potential.

The switching means provided in reference potential means 12 as a logic circuit are shown symbolically in FIG. 2. Signal input 24, signal output 26, and control input 28 are provided as logic interfaces in reference potential means 12. Signal input 24 can be connected to a bond pad or to an internal connecting point, from where a useful signal can be provided. Control input 28 is connected to the control device, from where a control signal can be provided. Signal output 26 is connected to the terminal and is provided for supplying the reference potential to the terminal.

A first inverter 32 is looped between signal input 24 and a NAND gate 36 (NOT-AND gate) in a useful signal line 52. A first nodal point 44, which is connected to a gate output 42 of NAND gate 36, is realized before first inverter 32, as a result of which a feedback loop 54 is formed. The signal applied at first node 44 is inverted in first inverter 32. A first connecting line 48 runs from second node 46 to a first gate input 38 of NAND gate 36, whereas a second connecting line 50 is connected to an input terminal of a second inverter 34. An output terminal of second inverter 34 is connected to signal output 28.

The logic states that can be present at nodal points 44, 46 are described hereinafter. Provided no useful signal is applied at signal input 24, it is to be assured that a defined electric potential is applied at signal output 26 and therefore at a terminal, not shown in greater detail. To achieve this, a pulse with a logic low level, which is conducted further to second gate input 40, is applied briefly at control input 28. Because NAND gate 36 always outputs an output signal with a logic high level when at least one of the gate inputs is at a logic low level, due to the low level of the control signal, a logic high level is output through NAND gate 36 to its gate output 42. This high level is fed back via feedback loop 54 to first nodal point 44, so that signal input 24 is at the high level. First gate input 38, in contrast, is at a logic low level because of the inversion of the high level applied at nodal point 44 by first inverter 32, and therefore assures that independent of the control signal at second gate input 40, gate output 42 remains at the logic high level. As a result, in the absence of a useful signal at signal input 24, a self-sustaining function of reference potential means 12 is assured, because it no longer matters which logic state is applied at control input 28. Moreover, the low level at second nodal point 46 and second inverter 34 make sure that signal output 26 is at a logic high level. For the terminal connected to signal output 26, this represents the preferred signal level in the absence of a useful signal; i.e., the terminal is at the desired reference potential.

Figure 3:
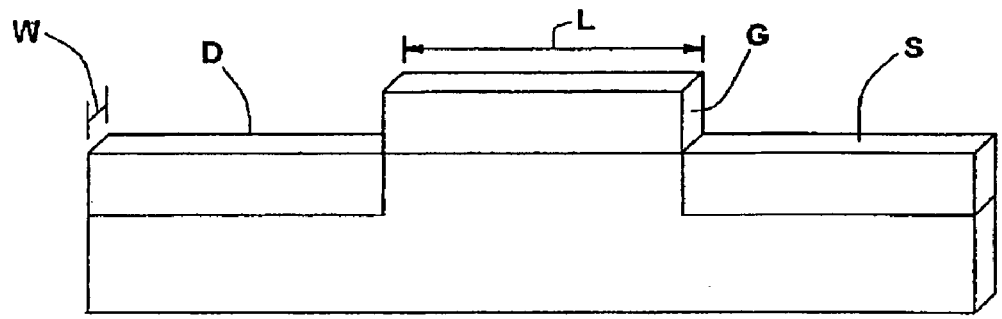
FIG. 3 shows a schematic diagram of a field-effect transistor with a width/length ratio less than 1.

Because NAND gate 36 is sized small—therefore the corresponding transistors have a width/length ratio less than 1, as is shown in greater detail schematically in FIG. 3—, by application of a useful signal to signal input 24 a switching of reference potential means 12 can be reliably brought about, by which the useful signal can be conducted further to signal output 26 and there made available to the terminal.

FIG. 3 shows a schematically depicted detail of a field-effect transistor. Control terminal G (gate terminal) of the field-effect transistor, said terminal made as a polysilicon layer region, is realized between a first current terminal S (source terminal) and a second current terminal D (drain terminal). In this case, a distance between the current terminals and therefore a length of control terminal G are selected so that a width/length ratio less than 1 is assured. In this case, the width W is about 1/6 of the length L of control terminal G (width to length 1.6/10).

Figure 4:
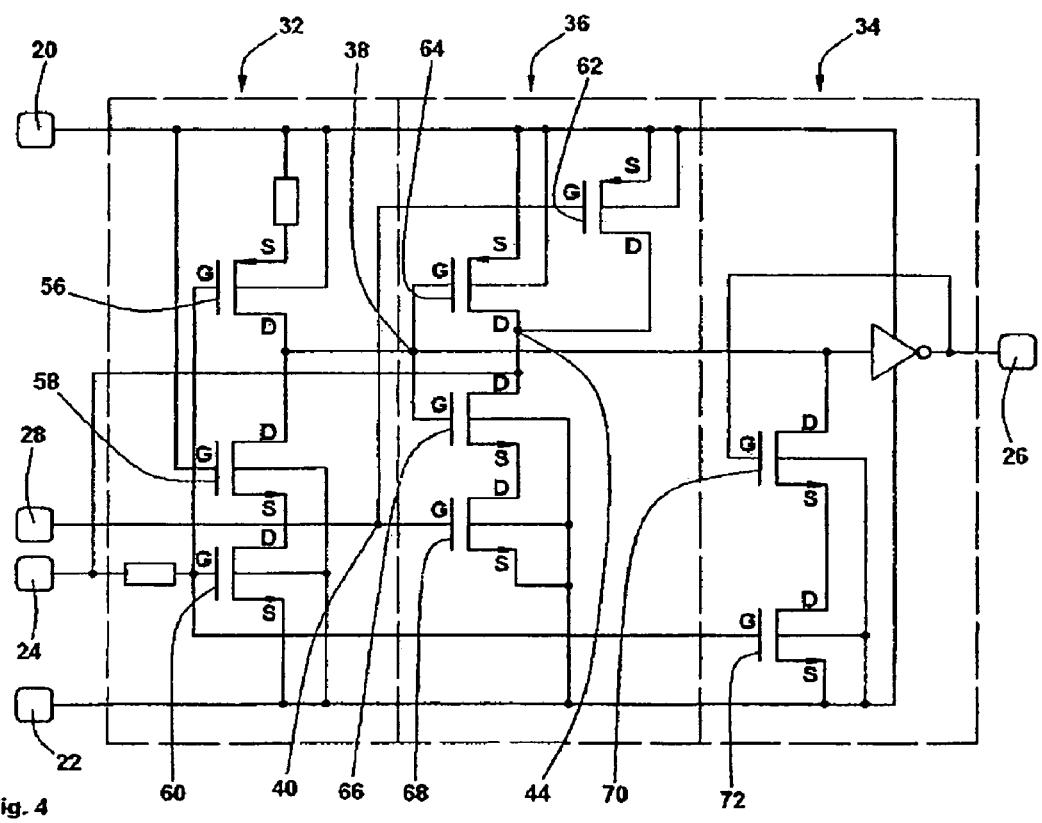
FIG. 4 shows a circuit diagram of the reference potential.

A circuit diagram for reference potential means 12 is shown in FIG. 4. The function blocks known from FIG. 2, therefore first inverter 32, second inverter 34, and NAND gate 36, are delimited from one another by dashed frames. Both inverters 32, 34 each have a plurality of field-effect transistors 56, 58, 60, 70, and 72, designed with a width/length ratio greater than 1. NAND gate 36 has four field-effect transistors 62, 64, 66, 68 with a small layout, which are realized with a width/length ratio less than 1.

Control input 28 is connected to a control terminal G (gate terminal) of NMOS transistor 68 and a control terminal G of PMOS transistor 62.

By applying a low level control signal to control input 28, PMOS transistor 62 switches the supply voltage, applied at supply terminal 20, to first nodal point 44. As a result, first nodal point 44 is at a logic high level. Provided that no useful signal is applied at signal input 24, as a result, control terminal G of NMOS transistor 60 is placed at a high level and switches through (in other words, the resistor between the current terminal S (source terminal) and current terminal D (drain terminal) becomes low-impedance and an electric current can flow). Because control terminal G of NMOS transistor 58 is permanently at the electric potential of supply terminal 20 and thereby is also switched through, first gate input 38 and therefore control terminals G of PMOS transistor 64 and NMOS transistor 66 are connected to ground, therefore have a low level, because PMOS transistor 56 is blocked because of the high level applied at signal input 24. As a result, PMOS transistor 64 switches through, whereas NMOS transistor 66 is blocked. Therefore, first nodal point 44 is at a high level even without the control signal and a self-sustaining of reference potential means 12 is assured. The logic low level applied at first gate input 38 is conducted further as an input signal to second inverter 34 and inverted there, so that an output signal applied at signal output 26 is at a logic high level.

If a useful signal with a logic high level is applied in this state to signal input 24, no change occurs in comparison with the previously described situation, because the high level was already predefined by reference potential means 12.

If, however, a useful signal with a logic low level is applied in this state to signal input 24, a switching of reference potential means 12 occurs. The switching occurs because NMOS transistor 60 is blocked by the low level at control input G and at the same time PMOS transistor 56 is switched through because of the low level at control input G. Therefore, at first gate input 38 the supply voltage is at a "high" level and is inverted by second inverter 34, so that a low level is output as an output signal.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit comprising:
   at least one terminal for coupling and/or decoupling electric signals; and
   an integrated reference potential unit assigned to the terminal for providing an electric reference potential to the terminal, wherein the integrated reference potential unit is switchable such that the integrated reference potential unit provides a defined electric reference potential at the terminal in the absence of a useful electrical signal.

2. The integrated circuit according to claim 1, wherein the integrated reference potential unit has a control input that is formed for coupling a control signal, provided for switching the integrated reference potential unit, to supply a reference potential at the terminal.

3. The integrated circuit according to claim 1, wherein the integrated reference potential unit has a switch, which is formed for an alternative provision of the reference potential or a useful signal at a signal output based on a useful signal level.

4. The integrated circuit according to claim 3, wherein the switch has a signal input, which is connected to a useful signal source.

5. The integrated circuit according to claim 4, wherein the switch is set up in such a way that a useful signal, applied at the signal input, causes the switching of the integrated reference potential unit by overriding so that the useful signal is provided at the signal output.

6. The integrated circuit according to claim 3, wherein the switch for the reference potential is self-sustaining.

7. The integrated circuit according to claim 6, wherein the switch has at least one field-effect transistor, which has a control terminal with a width/length ratio less than 1, less than 0.5, or less than 0.2.

8. The integrated circuit according to claim 6, wherein the switch has a NAND gate, which has at least one field-effect transistor, which has a control terminal with a width/length ratio less than 1, less than 0.5, or less than 0.2.

9. The integrated circuit according to claim 8, wherein a first input of the NAND gate is connected to the signal input and a second input of the NAND gate to the control input.

10. The integrated circuit according to claim 8, wherein a first inverter is disposed between the signal input and the first input of the NAND gate to invert the useful signal.

11. The integrated circuit according to claim 8, wherein the signal output is connected to a node between the first inverter and the first input of the NAND gate, and wherein a second inverter is provided between the node and the signal output.

12. The integrated circuit according to claim 1, wherein the electrical signals are digital signals.

13. The integrated circuit according to claim 6, wherein the switch comprises an electrical feedback loop.

14. The integrated circuit according to claim 1, wherein the integrated reference potential unit is switchable based on an electric pulse to thereby provide the defined electric reference potential to the terminal.

* * * * *